United States Patent
Sato et al.

(10) Patent No.: US 9,148,091 B2
(45) Date of Patent: Sep. 29, 2015

(54) AMPLIFIER AND WIRELESS COMMUNICATION DEVICE

(71) Applicant: FUJITSU SEMICONDUCTOR LIMITED, Yokohama-shi, Kanagawa (JP)

(72) Inventors: Tomoaki Sato, Edogawa (JP); Shinji Yamaura, Akiruno (JP)

(73) Assignee: SOCIONEXT INC., Yokohama (JP)

( * ) Notice: Subject to any disclaimer, the term of this patent is extended or adjusted under 35 U.S.C. 154(b) by 70 days.

(21) Appl. No.: 14/170,302

(22) Filed: Jan. 31, 2014

(65) Prior Publication Data
US 2014/0227988 A1  Aug. 14, 2014

(30) Foreign Application Priority Data
Feb. 13, 2013  (JP) ................................. 2013-025680

(51) Int. Cl.
| H04B 1/04 | (2006.01) |
| H03F 1/02 | (2006.01) |
| H03F 3/21 | (2006.01) |
| H03F 3/45 | (2006.01) |
| H03F 3/72 | (2006.01) |

(52) U.S. Cl.
CPC .............. *H03F 1/0277* (2013.01); *H03F 3/211* (2013.01); *H03F 3/45179* (2013.01); *H03F 3/72* (2013.01); *H03F 2203/45614* (2013.01); *H03F 2203/7233* (2013.01)

(58) Field of Classification Search
CPC ......... H03F 1/0277; H03F 3/211; H03F 3/72; H03F 2203/45614; H03F 2203/7233
USPC ............................. 455/127.3, 127.4; 330/51
See application file for complete search history.

(56) References Cited

U.S. PATENT DOCUMENTS

| 5,541,554 | A | * | 7/1996 | Stengel et al. | 330/51 |
| 7,486,133 | B2 | * | 2/2009 | Bakalski | 330/51 |
| 7,728,661 | B2 | | 6/2010 | Bockelman et al. | |
| 8,742,842 | B2 | * | 6/2014 | Engala et al. | 330/124 R |
| 8,823,449 | B2 | * | 9/2014 | Dieter et al. | 330/51 |
| 2013/0281040 | A1 | * | 10/2013 | Paul et al. | 455/246.1 |

FOREIGN PATENT DOCUMENTS

| JP | 09-261109 A | 10/1997 |
| JP | 11-163704 A | 6/1999 |

* cited by examiner

*Primary Examiner* — Duc M Nguyen
(74) *Attorney, Agent, or Firm* — Arent Fox LLP

(57) ABSTRACT

In a power amplifier including an amplifier circuit unit for high power mode and an amplifier circuit unit for low power mode provided in parallel thereto between input and output of the amplifier and where, when one amplifier circuit unit is in an operating state, the other amplifier circuit unit is in a non-operating state, a cross-coupled capacitor is provided between a drain of one of two transistors in output side and a gate of the other transistor in the amplifier circuit unit for high power mode, and a series circuit where a switch and a capacitor are coupled in series is coupled between a drain of the transistor of output side in the amplifier circuit unit for low power mode and a ground, the switch being in a conducting state in high power mode operation and being in a non-conducting state in low power mode operation.

16 Claims, 8 Drawing Sheets

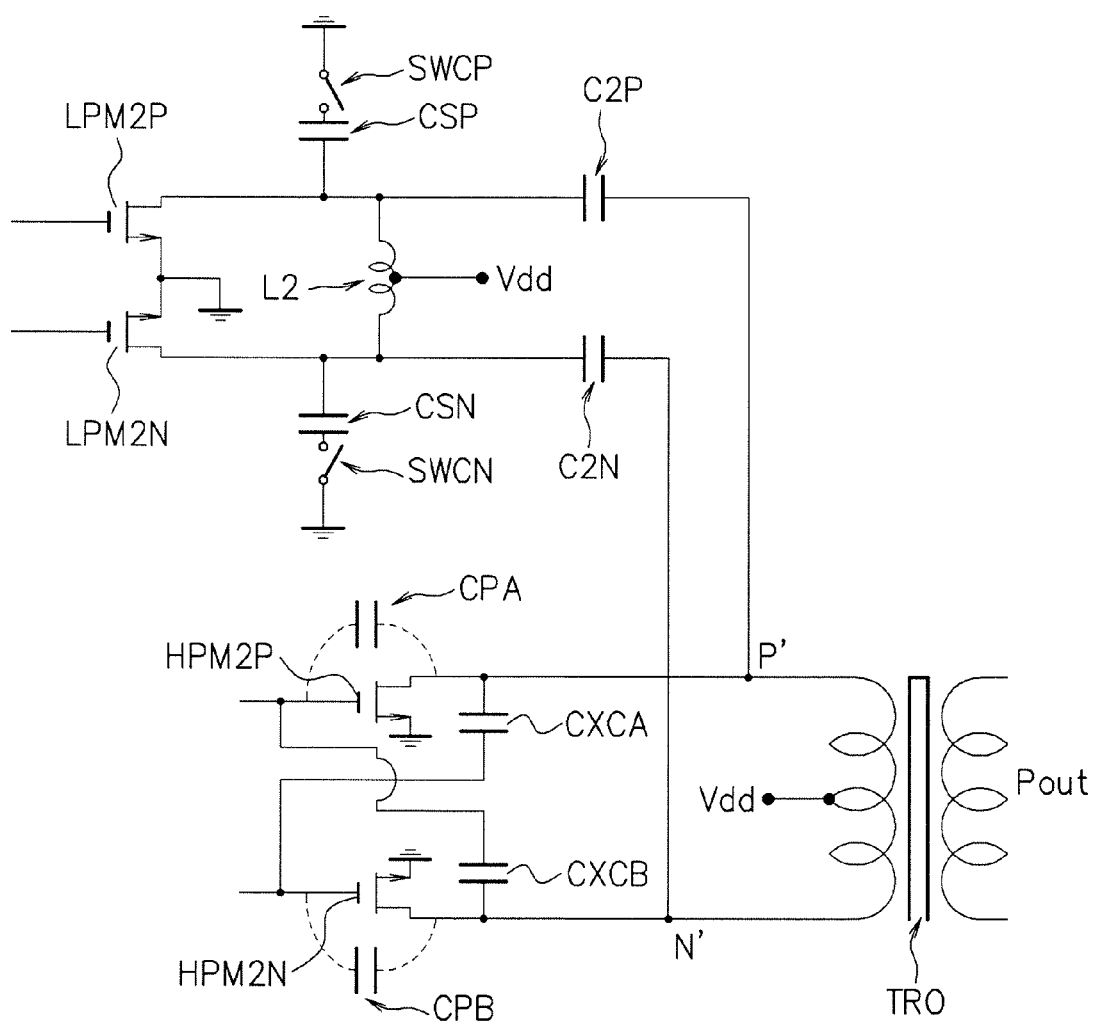
F I G. 2

F I G. 3
20
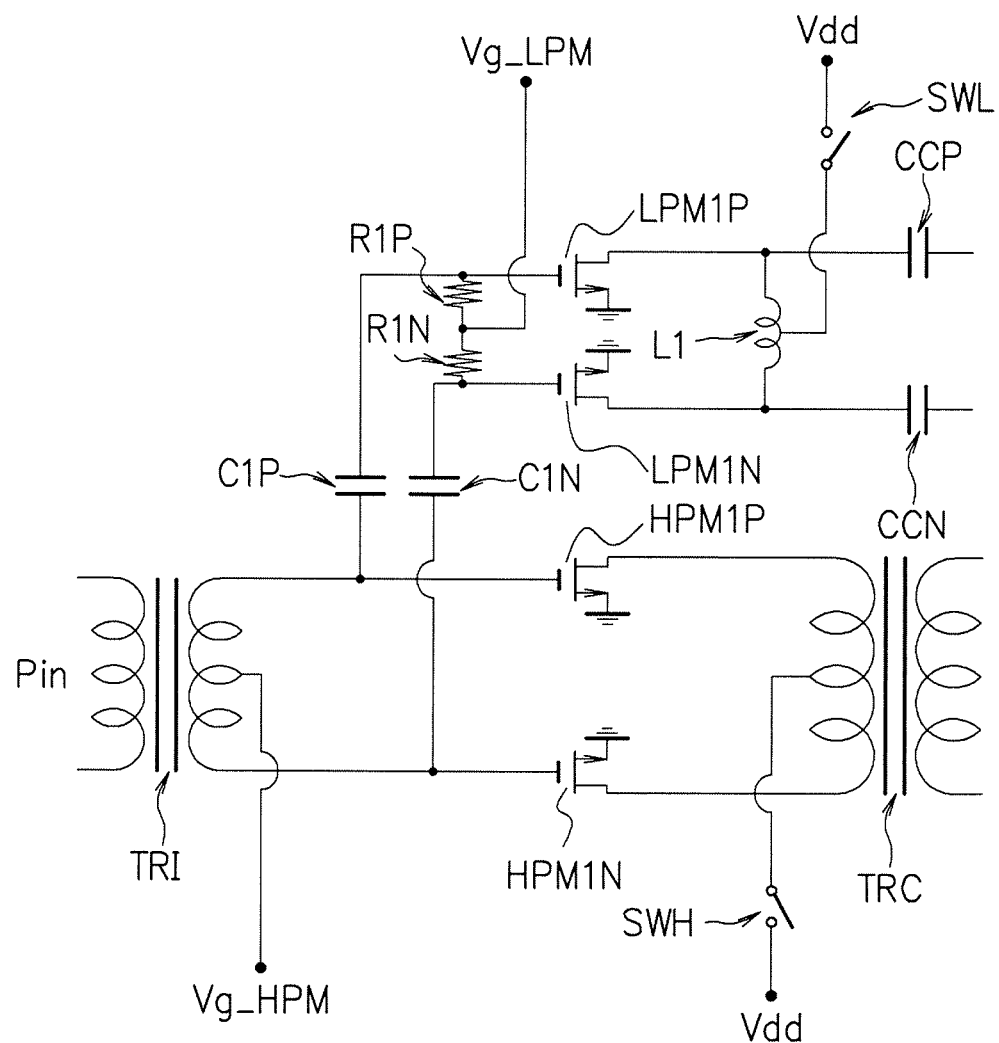

F I G. 10
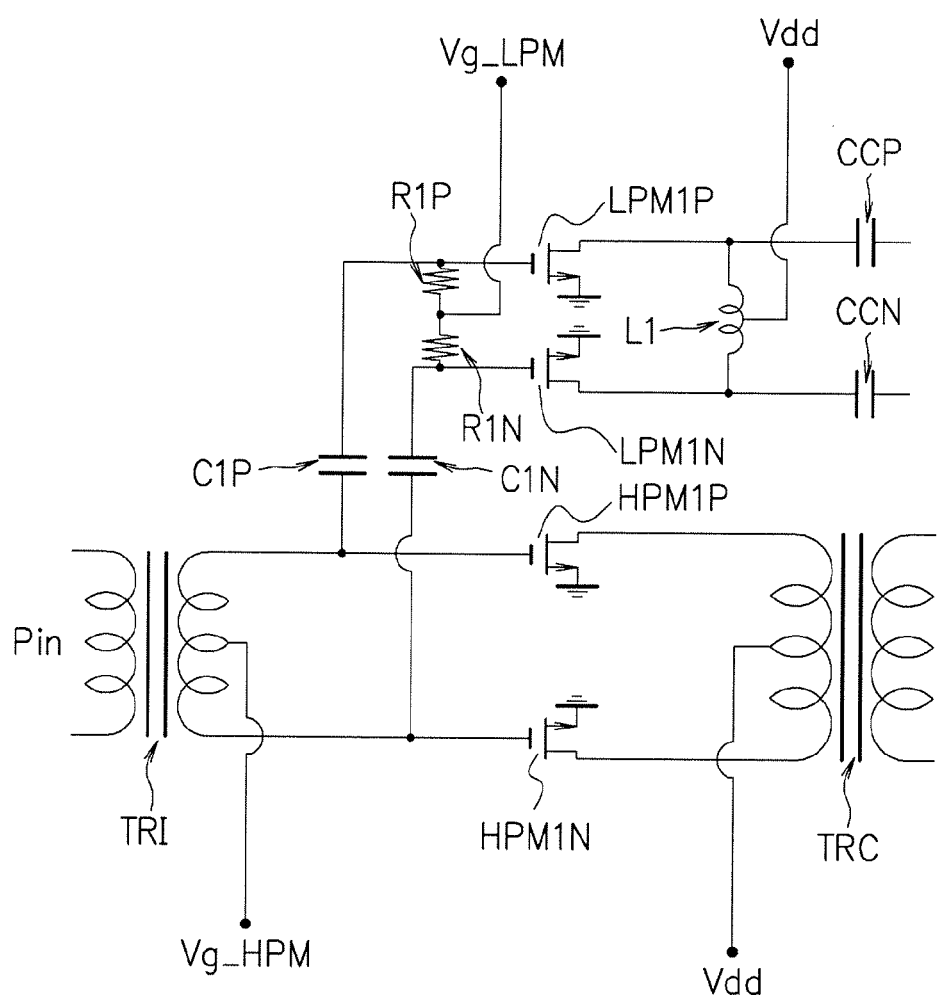

AMPLIFIER AND WIRELESS COMMUNICATION DEVICE

CROSS-REFERENCE TO RELATED APPLICATION

This application is based upon and claims the benefit of priority of the prior Japanese Patent Application No. 2013-025680, filed on Feb. 13, 2013, the entire contents of which are incorporated herein by reference.

FIELD

The embodiment discussed herein is directed to an amplifier and a wireless communication device.

BACKGROUND

A portable wireless communication device such as a mobile phone and a mobile communication terminal can have a longer operating time by a battery as a result of reducing an average consumption current. The average consumption current is found by multiplying a consumption current for each output power of a radio wave outputted from a wireless communication device via an antenna by an actual frequency in use. A use frequency distribution of DG09, a general index for use frequency, is depicted in FIG. 7A. It is found from FIG. 7A that the use frequency is high at an output power of around 0 dBm, which is a low output power, and current reduction in a neighborhood of 0 dBm is important in order to reduce an average consumption current.

An amplification efficiency of an power amplifier, as depicted in FIG. 7B, reaches maximum at a maximum output power and is not high at a low output power. As a method for raising an amplification efficiency at a low output power to reduce a consumption current and reduce an average consumption current, a power amplifier is used which has a power mode switching function switching amplifier circuit units to be used in correspondence with an output power. The power amplifier having the power mode switching function includes an amplifier circuit unit of a high power mode having a characteristic HPW depicted in FIG. 8A and an amplifier circuit unit of a low power mode having a characteristic LPW of not reacting a maximum output power of the power amplifier but having a high amplification efficiency at a low output power. In other words, the power amplifier having the power mode switching function is, as depicted in FIG. 8B, provided with an amplifier circuit unit (LPM) 302 of the low power mode different from an amplifier circuit unit (HPM) 301 of the high power mode between an input Pin and an output Pout in the power amplifier.

FIG. 9 is a diagram depicting a circuit configuration example of a conventional power amplifier having a power mode switching function. FIG. 9 depicts a circuit configuration example of a last stage (output side) amplifier and an output matching part in a power amplifier of a two stage amplifier configuration (for example, see Patent Document 1). An output side circuit of the power amplifier depicted in FIG. 9 has a low power mode circuit path which includes second stage transistors LPM2P, LPM2N driven at an operation in a low power mode, and a high power mode circuit path which includes second stage transistors HPM2P, HPM2N driven at an operation in a high power mode. These circuit paths are connected in parallel to a primary side of a transformer TRO to a secondary side of which an output load RL is connected.

The low power mode circuit path has an inductor L connected between outputs (drains) of the transistors LPM2P, LPM2N, and capacitors CX connected in series between outputs of the transistors LPM2P, LPM2N and a primary side of a transformer TRO. The high power mode circuit path has capacitors CH connected between outputs (drains) of the transistors HPM2P, HPM2N, respectively. A matching capacitor C1 is connected to the primary side of the transformer TRO in parallel and a matching capacitor C2 is connected to the secondary side of the transformer TRO in parallel.

[Patent Document 1] U.S. Pat. No. 7,728,661

In the conventional power amplifier depicted in FIG. 9, at the low power mode operation, the transistors LPM2P, LPM2N operate and the transistors HPM2P, HPM2N do not operate, but a current flows also to the transistors HPM2P, HPM2N which are not in operation, leading to increase of a power loss. At the high power mode operation, the transistors HPM2P, HPM2N operate and the transistors LPM2P, LPM2N do not operate, but a current flows also to the transistors LPM2P, LPM2N which are not in operation, leading to increase of the power loss. For example, at the low power mode operation, a power indicated by a solid line 401, the power outputted from the transistors LPM2P, LPM2N flows as indicated by a solid line 402, and a part of the power flows to a transistors HPM2P, HPM2N side as indicated by a broken line 403 and lost. As described above, in the conventional power amplifier having the power mode switching function, the transistor not in operation is directly connected to the circuit path in operation, and the power loss increases due to the transistor not in operation.

SUMMARY

According to an aspect of the embodiments, an amplifier includes a first amplifier circuit unit configured to output a signal having a maximum output power of the amplifier, and a second amplifier circuit unit provided in parallel with the first amplifier circuit unit between an input and an output of the amplifier and having a higher amplification efficiency than the first amplifier circuit unit in an output power lower than an output power of the first amplifier circuit unit. When one of the first amplifier circuit unit and the second amplifier circuit unit is in an operating state in which power amplification of a signal is performed, the other of the first amplifier circuit unit and the second amplifier circuit unit is in a non-operating state in which power amplification of the signal is not performed. The first amplifier circuit unit includes a first transistor whose drain is coupled to a first output node of the first amplifier circuit unit, a second transistor whose drain is coupled to a second output node of the first amplifier circuit unit, and a cross-coupled capacitor provided between the drain of one of the first transistor and the second transistor and a gate of the other of the first transistor and the second transistor. The second amplifier circuit unit includes a third transistor whose drain is coupled to an output node of the second amplifier circuit unit via a first capacitor, a first inductor coupled to a drain of the third transistor, and a series circuit. The series circuit includes a first switch and a second capacitor, and the first switch and the second capacitor are coupled in series between the drain of the third transistor and a ground, the first switch being in a conducting state when the first amplifier circuit unit is in the operating state and being in a non-conducting state when the second amplifier circuit unit is in the operating state.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 2 is a diagram depicting a circuit configuration example of an output side of the power amplifier in the present embodiment;

FIG. 3 is a diagram depicting a circuit configuration example of an input side of the power amplifier in the present embodiment;

FIG. 10 is a diagram depicting a circuit configuration example of an input side of the power amplifier having the power mode switching function.

DESCRIPTION OF EMBODIMENTS

Hereinafter, an embodiment will be described based on the drawings.

Figure 1:
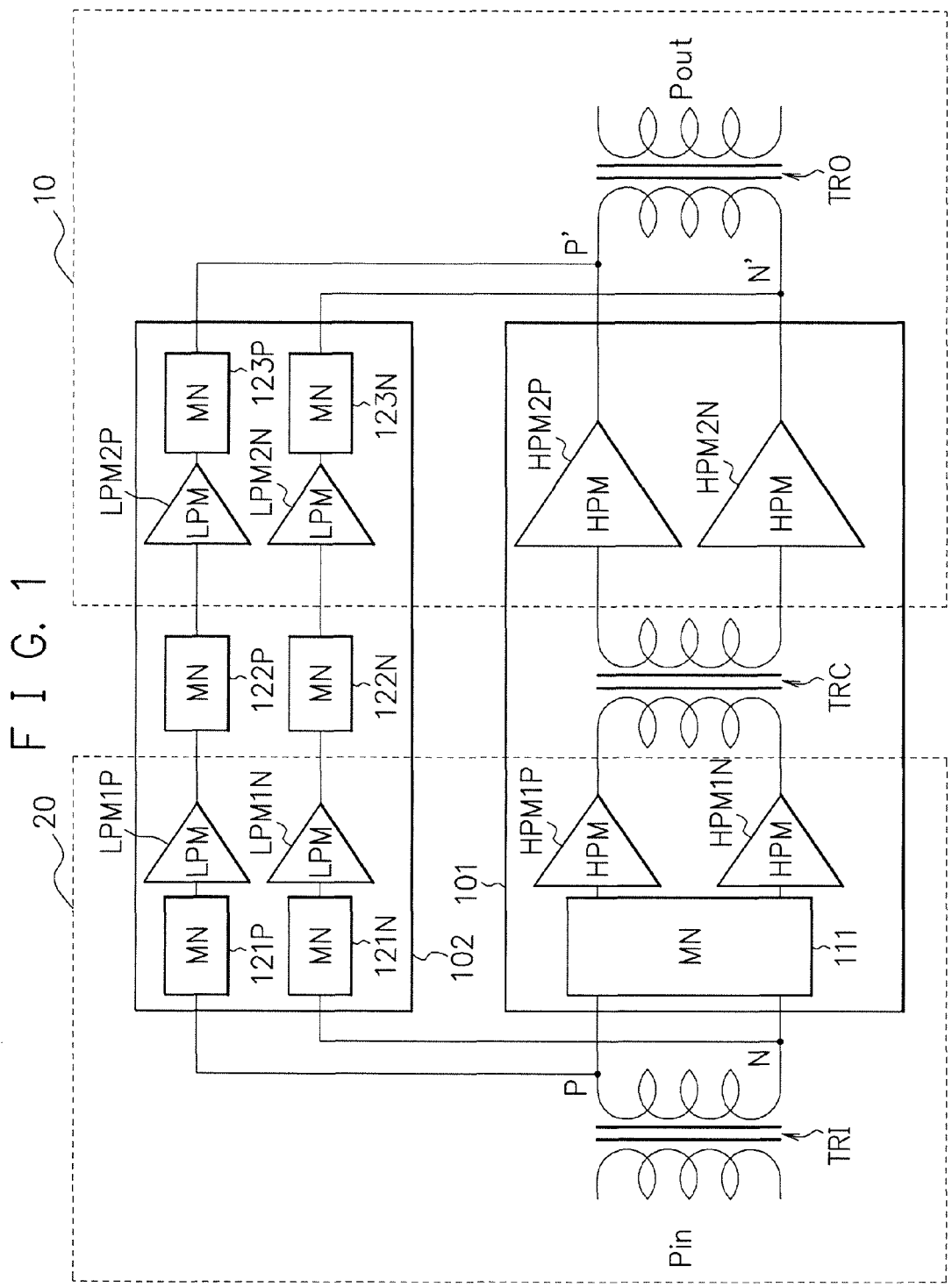
FIG. 1 is a diagram depicting a configuration example of a power amplifier in an embodiment.

FIG. 1 is diagram depicting a configuration example of a power amplifier as an amplifier in one embodiment. The power amplifier in the present embodiment has a power mode switching function, the power amplifier provided with an amplifier circuit unit 101 for high power mode and an amplifier circuit unit 102 for low power mode in parallel between an input Pin and an output Pout. The power amplifier in the present embodiment is constituted by a differential circuit and each of the amplifier circuit units 101, 102 has a two-stage amplifier configuration.

The amplifier circuit unit 101 for high power mode has an ability to output a signal having a maximum output power of the power amplifier. The amplifier circuit unit 102 for lower power mode does not have an ability to output the signal having the maximum output power of the power amplifier but has a higher amplification efficiency in a low output power than the amplifier circuit unit 101. At a high power mode operation, the amplifier circuit unit 101 for high power mode comes to an operating state of amplifying an inputted signal and the amplifier circuit unit 102 for low power mode comes to a non-operating state of not amplifying an input signal, so that the signal inputted from the input Pin is power-amplified in the amplifier circuit unit 101 for high power mode, the amplified signal being outputted from the output Pout. Further, at a lower power mode operation, the amplifier circuit unit 101 for high power mode comes to a non-operating state and the amplifier circuit unit 102 for lower power mode comes to an operating state, so that the signal inputted from the input Pin is power-amplified in the amplifier circuit unit 102 for low power mode, the amplified signal being outputted from the output Pout.

The amplifier circuit unit 101 for high power mode has transistors HPM1P, HPM1N of a first stage (input side), and transistors HPM2P, HPM2N of a second stage (output side). In the transistors HPM1P, HPM1N, inputs (gates) are connected to a secondary side of a transformer TRI via a matching network (matching circuit) 111, and outputs (drains) are connected to a primary side of a transformer TRC. In the transistors HPM2P, HPM2N, inputs (gates) are connected to a secondary side of the transformer TRC and outputs (drains) are connected to a primary side of a transformer TRO.

The amplifier circuit unit 102 for low power mode has transistors LPM1P, LPM1N of a first stage (input side) and transistors LPM2P, LPM2N for a second stage (output side). In the transistors LPM1P, LPM1N, inputs (gates) are connected to a secondary side of the transformer TRI via matching networks 121P, 121N. Outputs (drains) of the transistors LPM1P, LPM1N and inputs (gates) of the transistors LPM2P, LPM2N are connected via matching networks 122P, 122N. In the transistors LPM2P, LPM2N, outputs (drains) are connected to the primary side of the transformer TRO via matching networks 123P, 123N.

Note that a primary side of the transformer TRI is connected to the input Pin of the power amplifier, and a secondary side of the transformer TRO is connected to the output Pout of the power amplifier. Further, in FIG. 1, P, N, indicate connection points of the secondary side of the transformer TRI and input nodes of the amplifier circuit units 101, 102, and P', N' indicate connection points of output nodes of the amplifier circuit units 101, 102 and the primary side of the transformer TRO.

As described above, at the high power mode operation, the transistors HPM1P, HPM1N, HPM2P, HPM2N are driven and the amplifier circuit unit 101 for high power mode comes to the operating state, while the transistors LPM1P, LPM1N, LPM2P, LPM2N come to the a state of not being driven and the amplifier circuit unit 102 for low power mode comes to the non-operating state. At the low power mode operation, the transistors HPM1P, HPM1N, HPM2P, HPM2N come to a state of being not driven and the amplifier circuit unit 101 for high power mode comes to the non-operating state, while the transistors LPM1P, LPM1N, LPM2P, LPM2N are driven and the amplifier circuit unit 102 for low power mode comes to the operating state.

FIG. 2 is a diagram depicting a circuit configuration example of an output side 10 of the power amplifier in the present embodiment. In FIG. 2, the same reference symbol is given to the same component as a component depicted in FIG. 1.

In transistors HPM2P, HPM2N, gates are connected to the secondary side of the transformer TRC depicted in FIG. 1, drains are connected to the primary side of the transformer TRO, and sources are connected to the ground. A cross-coupled capacitor CXCA (CXCB) is provided between the drain of one of the transistors HPM2P, HPM2N and the gate of the other of the transistors. In other words, the drain of the transistor HPM2P is connected to one electrode of the cross-coupled capacitor CXCA and the gate of the transistor HPM2N is connected to the other electrode of the cross-coupled capacitor CXCA. The drain of the transistor HPM2N is connected to one electrode of the cross-coupled capacitor CXCB and the gate of the transistor HPM2P is connected to the other electrode of the cross-coupled capacitor CXCB.

In transistors LPM2P, LPM2N, gates are connected to the outputs (drains) of the transistors LPM1P, LPM1N depicted in FIG. 1 via matching networks 122P, 122N, drains are connected to the primary side of the transformer TRO via capacitors C2P, C2N, and sources are connected to the ground. An inductor L2 is connected between the drains of the transistors LPM2P, LPM2N.

The transistors LPM2P, LPM2N are provided with series circuits having capacitors CSP, CSN and switches SWCP, SWCN, respectively. In other words, one electrode of the capacitor CSP is connected to the drain of the transistor LPM2P, and the other electrode of the capacitor CSP is connected to the ground via the switch SWCP. One electrode of the capacitor CSN is connected to the drain of the transistor LPM2N, and the other electrode of the capacitor CSN is connected to the ground via the switch SWCN. The switches SWCP, SWCN are controlled, for example, by a control circuit 207 depicted in FIG. 6. Note that Vdd indicates a power supply node linked to the drain of each transistor.

At a high power mode operation, in a conventional configuration, powers outputted from transistors HPM2P, HPM2N are branched at connection points P', N' and leak to a non-operating transistors LPM2P, LPM2N side. Thus, a power loss occurs due to a parasite component of the non-operating transistors LPM2P, LPM2N to increase a power loss, leading to a larger consumption current. In the present embodiment, the switches SWCP, SWCN are made to be in a closed state (conducting state) at a high power mode operation and are made to be in an open state (non-conducting state) at a low power mode operation, and thereby a power loss by non-operating transistors LPM2P, LPM2N at the high power mode operation is suppressed.

In the present embodiment, as a result that the switches SWCP, SWCN are made to be in the closed state (conducting state) at the high power mode operation, an impedance of a node to which the switches SWCP, SWCN are connected becomes almost 0 (zero). Further, the inductor L2 and capacitors C2P, CSP between the switch SWCP and the connection point P' constitute a $\lambda/4$ resonance circuit. The inductor L2 and the capacitors C2N, CSN between the switch SWCN and the connection point N' constitute a $\lambda/4$ resonance circuit. Note that the inductor L2 and the capacitors C2P, CSP, C2N, CSN used above have characteristic values to constitute $\lambda/4$ resonance circuits when the switches SWCP, SWCN are made to be in the closed states (conducting states).

Thereby, an impedance for which the non-operating transistors LPM2P, LPM2N are taken into consideration from the connecting points P', N' becomes quite high, leading to an open state in terms of circuit. Therefore, a power is hard to flow to non-operating transistors LPM2P, LPM2N side, so that it is possible to suppress the power loss due to the parasite component of the non-operating transistors LPM2P, LPM2N at the high power mode operation.

At a low power operation also, in the conventional configuration, powers outputted from transistors LPM2P, LPM2N are branched at the connection points P', N' and leak to a non-operating transistors HPM2P, HPM2N side. Thus, a power loss occurs due to a parasite component of the non-operating transistors HPM2P, HPM2N to increase a power loss, leading to a larger consumption current. In the present embodiment, as a result that parasite capacitances CPA, CPB between the drain and the gate of the transistors HPM2P, HPM2N are cancelled by cross-coupled capacitors CXCA, CXCB at the low power mode operation, the power leaking to the non-operating transistors HPM2P, HPM2N at the low power mode operation is suppressed.

In other words, in the present embodiment, at the low power mode operation, the signal inputted to the parasite capacitance CPA and the signal inputted to the cross-coupled capacitor CXCB have a relation of opposite phases. The signal inputted to the parasite capacitance CPB and the signal inputted to the cross-coupled capacitor CXCA also have a relation of opposite phases. Therefore, as a result that the cross-coupled capacitor CXCB negates a charge of the parasite capacitance CPA, the parasite capacitance CPA between the drain and the gate of the transistor HPM2P is cancelled, and the power loss due to the parasite component of the non-operating transistor HPM2P is suppressed. Similarly, as a result that the cross-coupled capacitor CXCA negates a charge of the parasite capacitance CPB, the parasite capacitance CPB between the drain and the gate of the transistor HPM2N is cancelled, and the power loss due to the parasite component of the non-operating transistor HPM2N is suppressed.

In the power amplifier in the present embodiment depicted in FIG. 2, it is configured that the capacitor CSP, the switch SWCP, and the capacitor CSN and the switch SWCN are connected to the inductor L2 in parallel, but a configuration of connection to the connection points P', N' can also be considered. However, since an impedance for which the connection points P', N' are taken into consideration from the transistors HPM2P, HPM2N is low, a power loss due to a series parasite resistance of the switches SWCP and SWCN is not ignored at the high power mode operation. Therefore, it is more appropriate to connect in parallel to the inductor L2, which has a high impedance, as in the present embodiment.

The power loss can be suppressed more when the transistors LPM2P, LPM2N are also provided with cross-coupled capacitors, as the transistors HPM2P, HPM2N are provided with the cross-coupled capacitors CXCA, CXCB. However, the size of the transistors LPM2P, LPM2N is smaller compared with the size of the transistors HPM2P, HPM2N, and the parasite capacitance between the drain and the gate thereof is also small. Thus, the power loss due to the parasite component of the transistors LPM2P, LPM2N is small, so that the cross-coupled capacitor is not practically essential.

For the above reasons, in the power amplifier in the present embodiment, as depicted in FIG. 2, the series circuit having the capacitors CSP, CSN and the switches SWCP, SWCN is provided for the circuit path of the low power mode, while the cross-coupled capacitors CXCA, CXCB are provided for the circuit path of the high power mode.

Here, a conventional power amplifier having a power mode switching function has a following problem in an input side. FIG. 10 is a diagram depicting a circuit configuration example of an input side of the conventional power amplifier having the power mode switching function. FIG. 10 depicts a circuit configuration example of a first stage (input side) amplifier and an input matching part in a power amplifier of a two-stage amplifier configuration.

In transistors HPM1P, HPM1N of the first stage (input side) driven at a high power mode operation, gates are connected to a secondary side of a transformer TRI, drains are connected to a primary side of a transformer TRC, and sources are connected to the ground. In transistors LPM1P, LPM1N of the first stage (input side) driven at a low power mode operation, gates are connected to a secondary side of the transformer TRI via capacitors C1P, C1N, drains are connected to capacitors CCP, CCN, and sources are connected to the ground. An inductor L1 is connected between the drains of the transistors LPM1P, LPM1N. Note that Vg_HPM indicates a node giving the transistors HPM1P, HPM1N a gate bias, that Vg_LPM indicates a node giving the transistors LPM1P, LPM1N a gate bias, and that Vdd indicates a power source node linked to the drains of respective transistors.

In the conventional power amplifier depicted in FIG. 10, at the low power mode operation, the transistors HPM1P, HPM1N are not given the gate bias (Vg_HPM) and do not operate. However, when an RF signal (high frequency analog signal) is inputted from an input Pin, a voltage is applied to the gates of the transistors HPM1P, HPM1N, LPM1P, LPM1N. When gate voltages of the transistors HPM1P, HPM1N exceed a threshold voltage Vth by the RF signal from the input Pin, the transistors HPM1P, HPM1N come to an ON state and an unnecessary current flow, increasing a power loss. Note that the above can happen in the transistors LPM1P, LPM1N at the high power mode operation.

In the power amplifier of the present embodiment, as depicted in FIG. 3, whether or not a voltage Vdd is applied to drains of transistors HPM1P, HPM1N is controlled by a switch SWH, and whether or not the voltage Vdd is applied to drains of transistors LPM1P, LPM1N is controlled by the switch SWL. Thereby, flowing of an unnecessary current to the non-operating transistor is surely prevented and a power loss is suppressed.

FIG. 3 is a diagram depicting a circuit configuration example of an input side 20 of the power amplifier in the present embodiment. In FIG. 3, the same reference symbols are given to components the same as the components depicted in FIG. 1 and FIG. 10.

In the transistors HPM1P, HPM1N, gates are connected to a secondary side of a transformer TRI, drains are connected to a primary side of the transformer TRC, and sources are connected to the ground. In the transistors LPM1P, LPM1N, gates are connected to the secondary side of the transformer TRI via capacitors C1P, C1N, drains are connected to ones of electrodes of the capacitors CCP, CCN, and sources are connected to the ground. Note that the other electrodes of the capacitors CCP, CCN are connected to the gates of the transistors LPM2P, LPM2N depicted in FIG. 2. An inductor L1 is connected between the drains of the transistors LPM1P, LPM1N.

Vg_HPM indicates a node giving the transistors HPM1P, HPM1N a gate bias, Vg_LPM indicates a node giving the transistors LPM1P, LPM1N a gate bias, and Vdd indicates a power source node linked to the drains of the respective transistors. In the present embodiment, whether or not a drain voltage is given to the transistors HPM1P, HPM1N is controlled by a switch SWH, while whether or not a drain voltage is given to the transistors LPM1P, LPM1N is controlled by a switch SWL. The switches SWH, SWL are controlled by, for example, the control circuit 207 depicted in FIG. 6.

For example, at a high power mode operation, the switch SWH is made to be in a closed state (conducting state) and the switch SWL is made to be in an open state (non-conducting state). Therefore, to the transistors HPM1P, HPM1N the gate bias (Vg_HPM) is given and a voltage Vdd is applied as a drain voltage, so that the transistors HPM1P, HPM1N come to operating states. On the other hand, the transistors LPM1P, LPM1N are not given the gate bias (Vg_LPM) and do not operate. The drain voltage is not applied to the non-operating transistors LPM1P, LPM1N, either, and thus even if a large RF signal (high frequency analog signal) reaches the input Pin, an unnecessary current is prevented from flowing to the non-operating transistors LPM1P, LPM1N, so that a power loss can be suppressed.

Further, for example, at a low power mode operation, the switch SWH is made to be in an open state (non-conducting state) and the switch SWL is made to be in a closed state (conducting state). Therefore, to the transistors LPM1P, LPM1N, the gate bias (Vg_LPM) is given and the voltage Vdd is applied as the drain voltage, so that the transistors LPM1P, LPM1N come to operating states. On the other hand, the transistors HPM1P, HPM1N are not given the gate bias (Vg_HPM) and do not operate. The drain voltage is not applied to the non-operating transistors HPM1P, HPM1N, either, and thus even if a large RF signal reaches the input Pin, an unnecessary current is prevented from flowing to the non-operating transistors HPM1P, HPM1N, so that the power loss can be suppressed.

Figure 4:
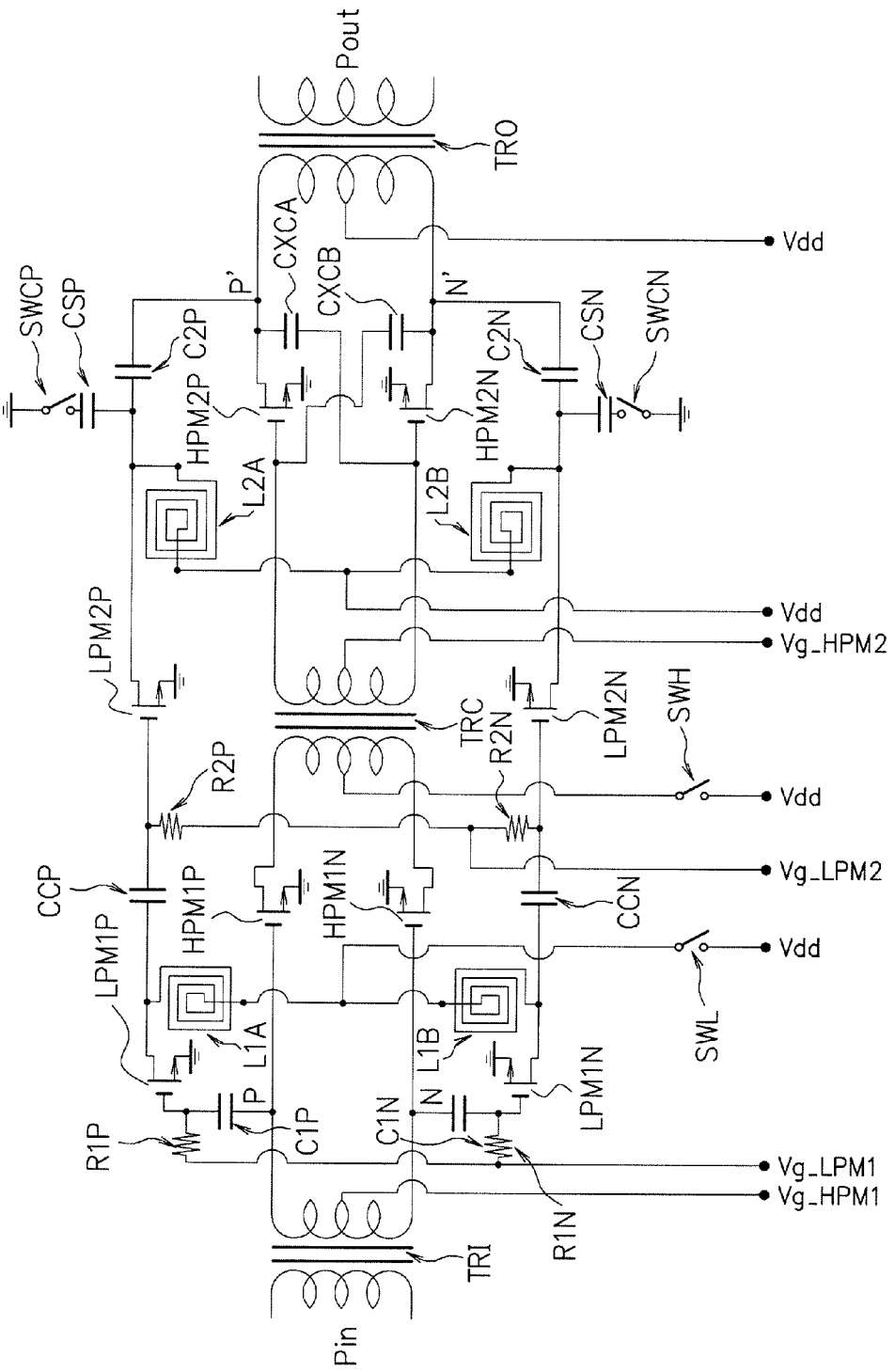
FIG. 4 is a diagram depicting an example of a circuit component disposition of the power amplifier in the present embodiment.

In the output side 10 of the power amplifier in the present embodiment described above, the parasite capacitances between the drains and gates of the transistors HPM2P, HPM2N is cancelled by the cross-coupled capacitors CXCA, CXCB, if differential signals at the connection points P', N' are balanced. For example, as depicted in FIG. 4, as a result that circuit elements related to a high power mode operation are disposed in a center part and circuit elements related to a low power mode operation are divided into two per the signal of the differential signals and disposed symmetrically (line-symmetrically) in relation to a circuit related to the high power mode operation, a balance of the differential signals at the connection points P', N' can be kept. The circuit elements divided into two related to the low power mode operation have the same circuit characteristic as each other.

FIG. 4 is a diagram depicting an example of a circuit element disposition (layout) of the power amplifier in the present embodiment. In FIG. 4, the same reference symbols are given to the same components as the components depicted in FIG. 2 and FIG. 3, and redundant explanation will be omitted. In FIG. 4, spiral inductors L1A, L1B correspond to what are obtained by dividing the inductance L1 depicted in FIG. 3 into two, while spiral inductors L2A, L2B correspond to what are obtained by dividing the inductance L2 depicted in FIG. 2 into two. The spiral inductors L1A, L1B, in order to make magnetic couplings of the spiral inductors between differentials uniform, have the same winding number and opposite winding directions to keep the balance of the differential signals. Similarly, the spiral inductors L2A, L2B also have the same winding numbers and opposite winding directions to keep the balance of the differential signals.

Note that Vg_HPM1 indicates a node giving transistors HPM1P, HPM1N a gate bias, while Vg_LPM1 indicates a node giving transistors LPM1P, LPM1N a gate bias. Vg_HPM2 indicates a node giving transistors HPM2P, HPM2N a gate bias, while Vg_LPM2 indicates a node giving transistors LPM2P, LPM2N a gate bias.

Figure 5:
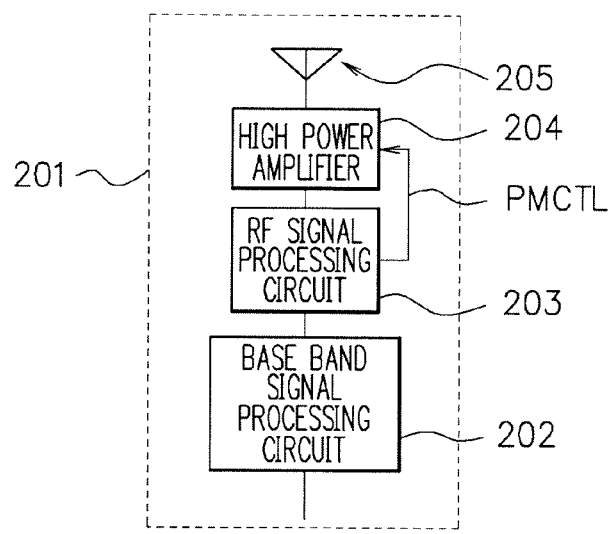
FIG. 5 is a diagram depicting an example of a wireless communication device using the power amplifier in the present embodiment.

FIG. 5 is a diagram depicting an example of a wireless communication device using the power amplifier in the present embodiment. The power amplifier in the present embodiment can be used as a high power amplifier 204 of a front end part 201 depicted in FIG. 5, which a wireless communication apparatus such as a mobile phone and a mobile communication terminal, for example, has. In the front end part 201 depicted in FIG. 5, an RF signal processing circuit 203 digital-analog-converts a digital signal which includes transmission data generated in a base band signal processing circuit 202, to convert the digital signal into an analog signal having a frequency higher than a frequency of the digital signal, amplifying the analog signal in the high power amplifier 204 and emitting the analog signal from an antenna 205. The high power amplifier 204 can switch whether to operate in a high power mode or to operate in a low power mode, in correspondence with a power mode switching control signal PMCTL from the RF signal processing circuit 203.

Figure 6:
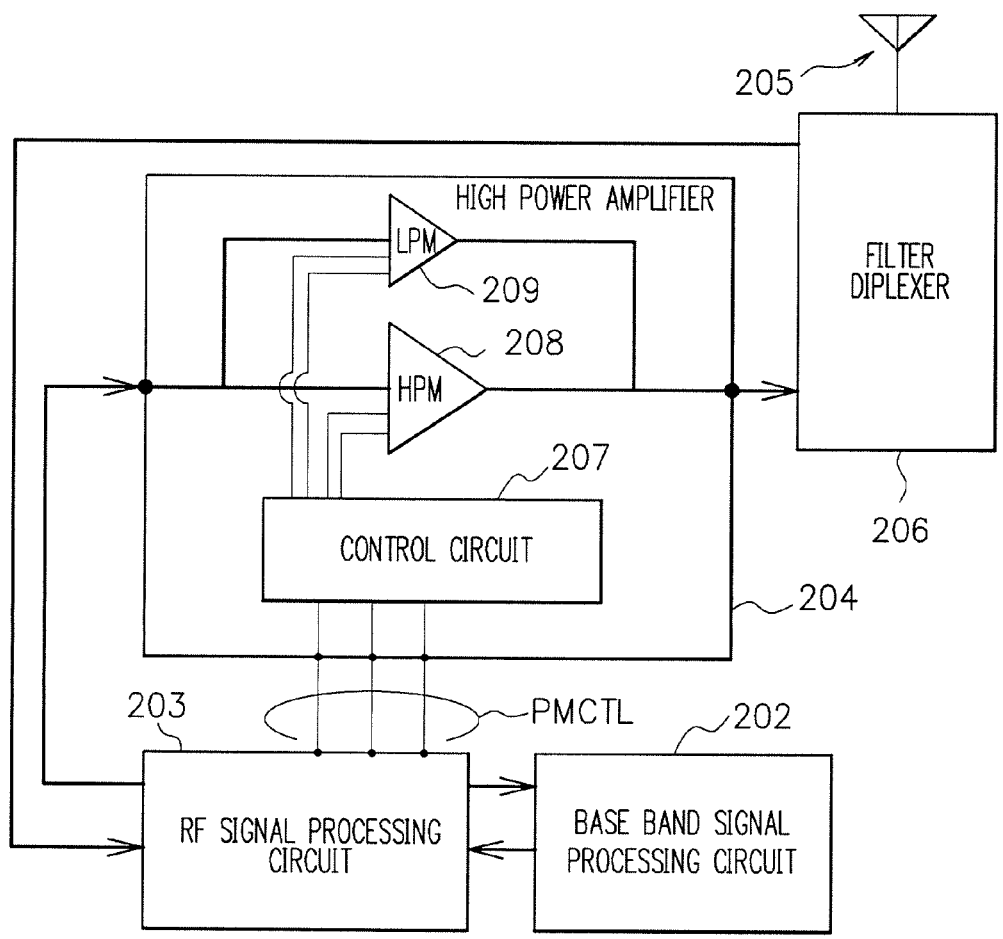
FIG. 6 is a diagram depicting a configuration example of the wireless communication device in the present embodiment.
Figure 7A:
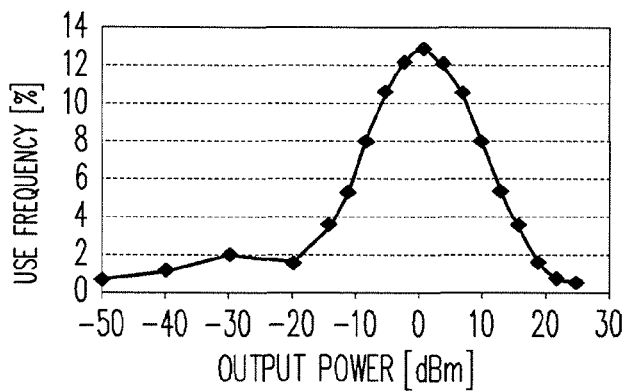
FIG. 7A is a graph depicting an example of a use frequency distribution.
Figure 7B:
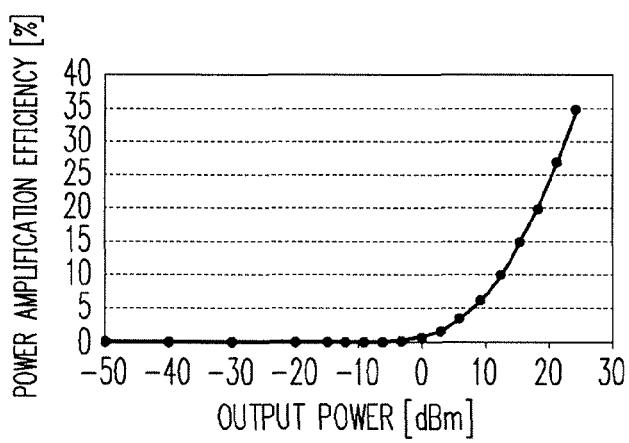
FIG. 7B is a graph depicting an example of an amplification efficiency characteristic of the power amplifier.
Figure 8A:
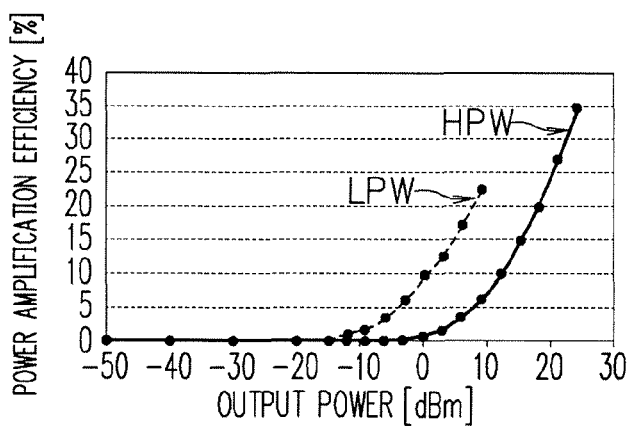
FIG. 8A and FIG. 8B are a graph and a diagram for explaining a power amplifier having a power mode switching function.
Figure 8B:
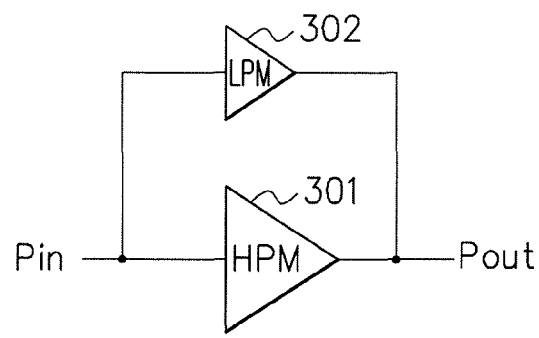
Figure 9:
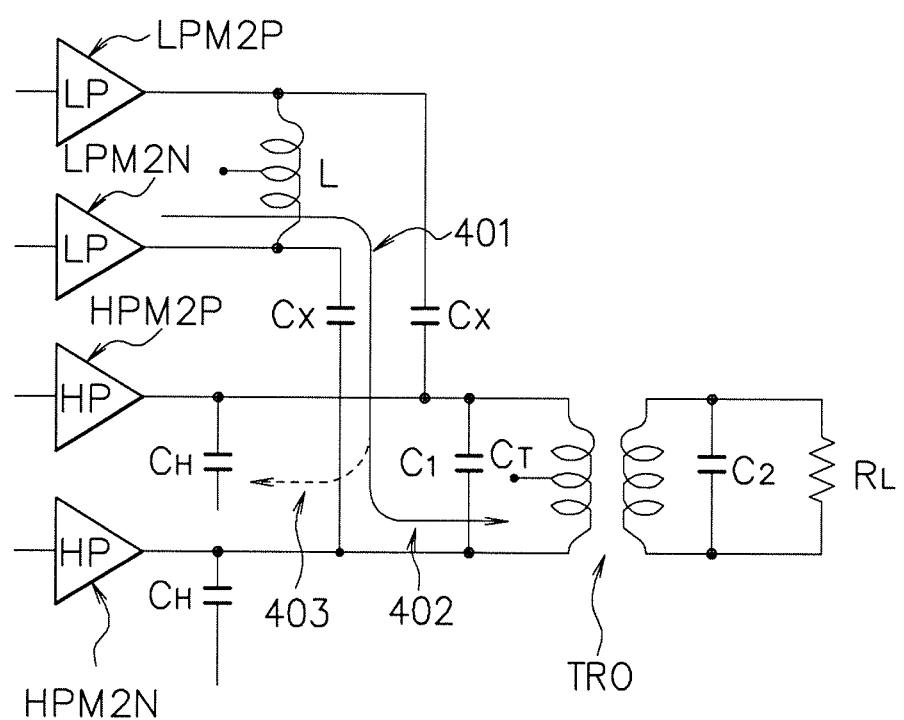
FIG. 9 is a diagram depicting a circuit configuration example of an output side of a power amplifier having a power mode switching function.

FIG. 6 is a diagram depicting a configuration example of a wireless communication device in the present embodiment. FIG. 6 depicts a front end part in the wireless communication device. In FIG. 6, the same reference symbol is given to a component having the same function as that of the component depicted in FIG. 5, and redundant explanation will be omitted. A filter duplexer 206 is a filter to isolate transmission signal and reception signal.

A high power amplifier 204 has a control circuit 207, an amplifier circuit unit 208 for high power mode, and an amplifier circuit unit 209 for low power mode. The amplifier circuit unit 208 for high power mode corresponds to the amplifier circuit unit 101 for high power mode depicted in FIG. 1, while the amplifier circuit unit 209 for low power mode corresponds to the amplifier circuit unit 102 for low power mode depicted in FIG. 1. The control circuit 207 receives a control signal PMCTL from the RF signal processing circuit 203 and performs a control processing or the like corresponding to the control signal PMCTL. The control signal PMCTL is a control signal indicating whether to operate the high power amplifier 204 at a high power mode or to operate the high power amplifier 204 at a low power mode. The control circuit 207 controls a bias of a transistor in correspondence with the control signal PMCTL, for example, and performs ON/OFF control of the transistor or a switch which the amplifier circuit unit 208 for high power mode or the amplifier circuit unit 209 for low power mode has.

In the wireless communication device depicted in FIG. 6, in a case where a request to lower an output power is included in a reception signal received by an antenna 205 when the high power amplifier 204 is operating at the high power mode, for example, the RF signal processing circuit 203 interprets the request and outputs a control signal PMCTL to instruct switching to a low power mode operation to the high power amplifier 204. The control circuit 207 of the high power amplifier 204 having received the control signal PMCTL controls to make the amplifier circuit unit 208 for high power mode be in an OFF state (non-operating state) and make the amplifier circuit unit 209 for low power mode be in an ON state (operating state), switching an operating state of the high power amplifier 204 to the low power mode.

The amplifier in the above embodiment, when one amplifier circuit unit is in an operating state of performing power amplification of a signal, can suppress a current leakage to the other amplifier circuit unit, and can suppress a power loss due to a non-operating transistor which the other amplifier circuit unit has.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An amplifier comprising:
    a first amplifier circuit unit configured to output a signal having a maximum output power of the amplifier; and
    a second amplifier circuit unit provided in parallel with the first amplifier circuit unit between an input and an output of the amplifier and having a higher amplification efficiency than the first amplifier circuit unit in an output power lower than an output power of the first amplifier circuit unit,
    wherein, when one of the first amplifier circuit unit and the second amplifier circuit unit is in an operating state in which power amplification of a signal is performed, the other of the first amplifier circuit unit and the second amplifier circuit unit is in a non-operating state in which power amplification of the signal is not performed,
    wherein the first amplifier circuit unit includes:
        a first transistor whose drain is coupled to a first output node of the first amplifier circuit unit;
        a second transistor whose drain is coupled to a second output node of the first amplifier circuit unit; and
        a cross-coupled capacitor provided between the drain of one of the first transistor and the second transistor and a gate of the other of the first transistor and the second transistor, and
    wherein the second amplifier circuit unit includes:
        a first capacitor;
        a third transistor whose drain is coupled to an output node of the second amplifier circuit unit via the first capacitor;
        a first inductor coupled to a drain of the third transistor; and
        a series circuit in which a first switch and a second capacitor are coupled in series between the drain of the third transistor and a ground, the first switch being in a conducting state when the first amplifier circuit unit is in the operating state and being in a non-conducting state when the second amplifier circuit unit is in the operating state.

2. The amplifier according to claim 1,
    wherein the signal amplified by the amplifier is a differential signal, and
    wherein a first circuit component related to one signal of the differential signal among circuit components of the second amplifier circuit unit and a second circuit component related to the other signal of the differential signal among the circuit components of the second amplifier circuit unit are disposed symmetrically with regard to the first amplifier circuit unit.

3. The amplifier according to claim 2,
    wherein circuit characteristics of the first circuit component and the second circuit component are same.

4. The amplifier according to claim 1,
    wherein the first amplifier circuit unit includes:
        a fourth transistor whose gate is coupled to an input node of the first amplifier circuit unit; and
        a second switch configured to cut off supply of a drain voltage of the fourth transistor when the second amplifier circuit unit is in the operating state, and
    wherein the second amplifier circuit unit includes:
        a fifth transistor whose gate is coupled to an input node of the second amplifier circuit unit; and
        a third switch configured to cut off supply of a drain voltage of the fifth transistor when the first amplifier circuit unit is in the operating state.

5. The amplifier according to claim 4, comprising:
    a control circuit configured to receive a control signal indicating which of the first amplifier circuit unit and the second amplifier circuit unit is to be made in the operating state and to control each of the first switch, the second switch and the third switch on the basis of the control signal.

6. The amplifier according to claim 4,
wherein the signal amplified by the amplifier is a differential signal, and
wherein a first circuit component related to one signal of the differential signal among circuit components of the second amplifier circuit unit and a second circuit component related to the other signal of the differential signal among the circuit components of the second amplifier circuit unit are disposed symmetrically with regard to the first amplifier circuit unit.

7. The amplifier according to claim 6,
wherein circuit characteristics of the first circuit component and the second circuit component are same.

8. The amplifier according to claim 1, comprising:
a control circuit configured to receive a control signal indicating which of the first amplifier circuit unit and the second amplifier circuit unit is to be made in the operating state and to control the first switch on the basis of the control signal.

9. A wireless communication device, comprising:
a signal processing circuit configured to convert a digital signal included transmission data into an analog signal whose frequency is higher than a frequency of the digital signal; and
an amplifier configured to amplify and output the analog signal converted by the signal processing circuit,
wherein the amplifier includes:
a first amplifier circuit unit configured to output a signal having a maximum output power of the amplifier; and
a second amplifier circuit unit provided in parallel with the first amplifier circuit unit between an input and an output of the amplifier and having a higher amplification efficiency than the first amplifier circuit unit in an output power lower than an output power of the first amplifier circuit unit,
wherein, when one of the first amplifier circuit unit and the second amplifier circuit unit is in an operating state in which power amplification of a signal is performed, the other of the first amplifier circuit unit and the second amplifier circuit unit is in a non-operating state in which power amplification of the signal is not performed,
wherein the first amplifier circuit unit includes:
a first transistor whose drain is coupled to a first output node of the first amplifier circuit unit;
a second transistor whose drain is coupled to a second output node of the first amplifier circuit unit; and
a cross-coupled capacitor provided between the drain of one of the first transistor and the second transistor and a gate of the other of the first transistor and the second transistor, and
wherein the second amplifier circuit unit includes:
a first capacitor;
a third transistor whose drain is coupled to an output node of the second amplifier circuit unit via the first capacitor;
a first inductor coupled to a drain of the third transistor; and
a series circuit in which a first switch and a second capacitor are coupled in series between the drain of the third transistor and a ground, the first switch being in a conducting state when the first amplifier circuit unit is in the operating state and being in a non-conducting state when the second amplifier circuit unit is in the operating state.

10. The wireless communication device according to claim 9,
wherein the signal amplified by the amplifier is a differential signal, and
wherein a first circuit component related to one signal of the differential signal among circuit components of the second amplifier circuit unit and a second circuit component related to the other signal of the differential signal among the circuit components of the second amplifier circuit unit are disposed symmetrically with regard to the first amplifier circuit unit.

11. The wireless communication device according to claim 10,
wherein circuit characteristics of the first circuit component and the second circuit component are same.

12. The wireless communication device according to claim 9,
wherein the first amplifier circuit unit includes:
a fourth transistor whose gate is coupled to an input node of the first amplifier circuit unit; and
a second switch configured to cut off supply of a drain voltage of the fourth transistor when the second amplifier circuit unit is in the operating state, and
wherein the second amplifier circuit unit includes:
a fifth transistor whose gate is coupled to an input node of the second amplifier circuit unit; and
a third switch configured to cut off supply of a drain voltage of the fifth transistor when the first amplifier circuit unit is in the operating state.

13. The wireless communication device according to claim 12,
wherein the signal processing circuit outputs to the amplifier a control signal indicating which of the first amplifier circuit unit and the second amplifier circuit unit is to be made in the operating state, and
wherein the amplifier includes a control circuit configured to control the first switch on the basis of the control signal.

14. The wireless communication device according to claim 12,
wherein the signal amplified by the amplifier is a differential signal, and
wherein a first circuit component related to one signal of the differential signal among circuit components of the second amplifier circuit unit and a second circuit component related to the other signal of the differential signal among the circuit components of the second amplifier circuit unit are disposed symmetrically with regard to the first amplifier circuit unit.

15. The wireless communication device according to claim 14,
wherein circuit characteristics of the first circuit component and the second circuit component are same.

16. The wireless communication device according to claim 9,
wherein the signal processing circuit outputs to the amplifier a control signal indicating which of the first amplifier circuit unit and the second amplifier circuit unit is to be made in the operating state, and
wherein the amplifier includes a control circuit configured to control the first switch on the basis of the control signal.

* * * * *